United States Patent [19]

Kopf et al.

[11] Patent Number: 5,268,582

[45] Date of Patent: Dec. 7, 1993

[54] P-N JUNCTION DEVICES WITH GROUP IV ELEMENT-DOPED GROUP III-V COMPOUND SEMICONDUCTORS

[75] Inventors: Rose F. Kopf, Bound Brook; Erdmann F. Schubert, New Providence, both of N.J.

[73] Assignee: AT&T Bell Laboratories, Murray Hill, N.J.

[21] Appl. No.: 934,840

[22] Filed: Jun. 24, 1992

[51] Int. Cl.⁵ .................. H01L 29/161; H01L 29/205
[52] U.S. Cl. ........................................ 257/15; 257/21; 257/96; 257/102; 437/951
[58] Field of Search ................... 257/15, 21, 94, 96, 257/102, 461; 437/951, 987, 110

[56] References Cited

U.S. PATENT DOCUMENTS

| | | | |
|---|---|---|---|
| 4,792,832 | 12/1988 | Baba et al. | 257/194 |
| 5,107,306 | 4/1992 | Blood et al. | 257/13 |
| 5,136,345 | 8/1992 | Kasahara | 257/14 |

FOREIGN PATENT DOCUMENTS 4-5817  1/1992  Japan ............................. 257/15

OTHER PUBLICATIONS

H. Ito et al. "Carbon Incorporation in (alGa)As, (AlIn)As and (GaIN)AS Ternary Alloys Grown by MBE", *Japanese Jrnl. Applied Physics* vol. 30, No. 64A, Jun. 1991, pp. L944-L947.

H. Toyoshima, et al. "Growth by Molecular-Beam Epitaxy and Characterization of $(InAs)_m$ $(GaAs)_m$ Short Period Superlattices..." *Jrnl. of Applied Physics*, vol. 68, No. 3, Aug. 1, 1990, pp. 1281-1286.

T. Akatsuka, et al. "Heavily Carbon-Doped P-Type InGaAs Grown by Metalogranic Molecular Beam Epitaxy", *Japanese Jrnl. of Applied Physics*, vol. 29, No. 4, Apr. 1990, pp. L537-L539.

K. Nishi, et al. "Structural and Optical Studies on MBE Grown $(InAs)_m$ and $(InAs)_m(AlAs)_m$ $(GaAs)_m$ Short-Period..." *Jrnl. of Crystal Growth* 95, (1989), Elsevier Science Publishers B.V. (North-Holland Physics Publishing Div), pp. 202-205.

R. J. Malik et al. "Carbon Doping in MBE of GaAs from a Heated Graphite Filament", *Appl. Phys. Lett.*, vol. 53, 26), Dec. 26, 1988, pp. 2661-2663.

*Primary Examiner*—Rolf Hille
*Assistant Examiner*—Minhloan Tran
*Attorney, Agent, or Firm*—Oleg E. Alber

[57] ABSTRACT

This invention embodies p-n junction devices comprising Group III-V compound semiconductors in which the p or n or both p and n regions are formed by a superlattice selectively doped with an amphoteric Group IV element dopant selected from carbon, germanium and silicone. The superlattice includes a plurality of periods, each including two layers. Depending on the conductivity type, only one of the layers in the periods forming the superlattice region of said type of conductivity is selectively doped with said dopant, leaving the other layer in these periods undoped. The superlattice is formed by Molecular Beam Epitaxy technique, and the dopant is incorporated into respective layers by delta-doping as in a sheet centrally deposited between monolayers forming the respective layers of the period. Each period includes 5 to 15 monolayers deposited in the two layers in a numerical ratio corresponding to a cation compositional ratio in the compound semiconductor. Low growth temperatures, e.g. ranging from 410° to 450° C. lead to mirror-like surfaces. For a compound semiconductor $Ga_{0.47}In_{0.53}As$, the GaAs/InAs ordered superlattices with eight monolayers per period are grown in a ratio of 0.47/0.53. At free carrier concentrations of $10^{16} cm^{-3}$, carrier mobilities of 200 and 2300 $cm^2/Vs$ for p-type and n-type are obtained with carbon as the amphoteric dopant.

27 Claims, 4 Drawing Sheets

P-N JUNCTION DEVICES WITH GROUP IV ELEMENT-DOPED GROUP III-V COMPOUND SEMICONDUCTORS

FIELD OF THE INVENTION

This invention concerns p-n junction devices having Group IV element-doped Group III-V compound semiconductors.

BACKGROUND OF THE INVENTION

Group III-V compound semiconductors are desirable materials in high-speed electronic and opto-electronic semiconductor devices such as lasers, amplifiers, light-emitting diodes, and photodetectors. These materials are being included in devices in which layers may be intrinsic, p-type or n-type conductivity. Of special interest are such Group III-V compound semiconductors as (GaIn)As, (AlIn)As, (AlGaIn)As, (GaInP), (AlIn)P and (AlGaIn)P. In these materials, dopants such as Be, Zn and C are often used to obtain p-type conductivity, and Si, Ge and Sn to obtain n-type conductivity. However, at higher doping levels $1 \times 10^{19}$ cm$^{-3}$, many of these dopants have a tendency to diffuse and surface segregate, therefore precluding well-controlled incorporation of these dopants into Group III-V compound semiconductors, while carbon tends toward formation of compensated materials. Japanese Laid-Open Patent application No. 4-5817 discloses the use of Group IV elements, especially carbon, as a p-type dopant in a $Ga_{0.47}In_{0.53}As$ structure, lattice-matched to an InP substrate, by means of a multiperiod superlattice in which each period included a C-doped layer of GaAs (8 monolayers thick), an undoped $In_{0.3}Ga_{0.7}As$ layer (0.7 monolayers thick), an undoped InAs layer (10.6 monolayers thick) and an undoped $In_{0.3}Ga_{0.7}As$ layer (0.7 monolayers thick). The GaAs layers were homogeneously doped with carbon. The n-type doping of InAs region was obtained with Si in a conventional manner. However, while the Japanese application teaches p-doping of $Ga_{0.47}In_{0.53}As$ superlattice, doping of $Ga_{0.47}In_{0.53}As$ by an amphoteric dopant to achieve both p- and n-type conductivity in different regions of the superlattice is still not available. Therefore, it would be desirable to form either p- or n- type conductivity or both in III-V compound semiconductor devices using a single, amphoteric dopant which would have low diffusion coefficient, and have opposite conductivity type in different portions of the ternary alloy.

SUMMARY OF THE INVENTION

This invention embodies p-n junction devices comprising Group III-V compound semiconductors in which the p or n or both p and n regions are formed by a superlattice selectively doped with an amphoteric Group IV element dopant selected from carbon, germanium and silicone. The superlattice includes a plurality of periods, each including two layers. Depending on the conductivity type, only one of the layers in the periods forming the superlattice region of said type of conductivity is selectively doped with said dopant, leaving the other layer in these periods undoped. The superlattice is formed by Molecular Beam Epitaxy technique, and the dopant is incorporated into respective layers by delta-doping as a sheet centrally deposited between monolayers forming the respective layers of the period. Each period includes 5 to 15 monolayers deposited in the two layers in a numerical ratio corresponding to a cation compositional ratio in the compound semiconductor. Low growth temperatures, e.g. ranging from 410° to 450° C. lead to mirror-like surfaces. For a compound semiconductor $Ga_{0.47}In_{0.53}As$, the GaAs/InAs ordered superlattices with eight monolayers per period are grown in a ratio of 0.47/0.53. At free carrier concentrations of $10^{16}$ cm$^{-3}$, carrier mobilities of 200 and 2300 cm$^2$/Vs for p-type and n-type are obtained with carbon as the amphoteric dopant.

DETAILED DESCRIPTION

Figure 1:
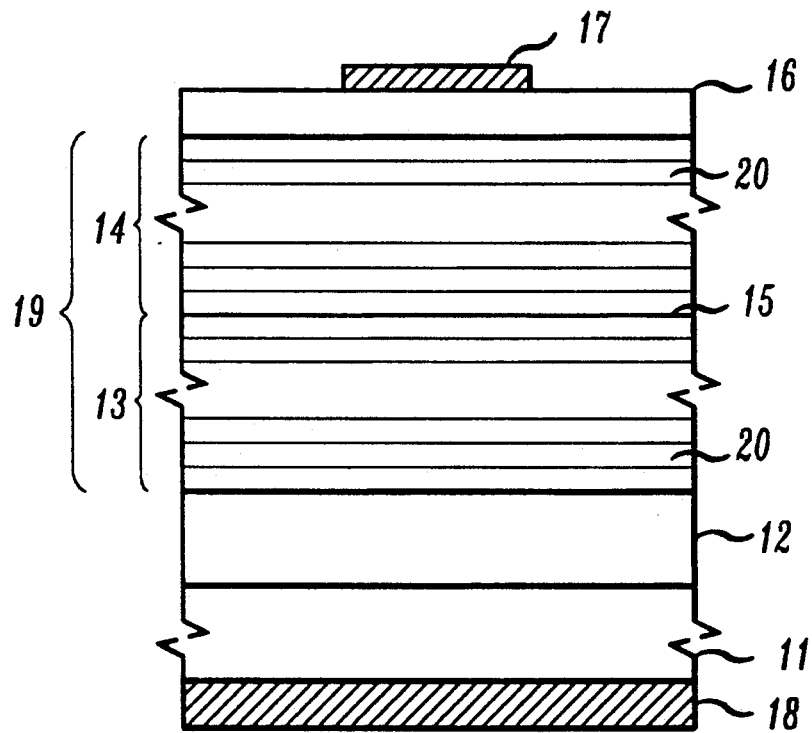
FIG. 1 is a schematic diagram of a device with a GaAs/InAs superlattice which is selectively δ-doped in the center of the InAs and GaAs layers.
Figure 2:
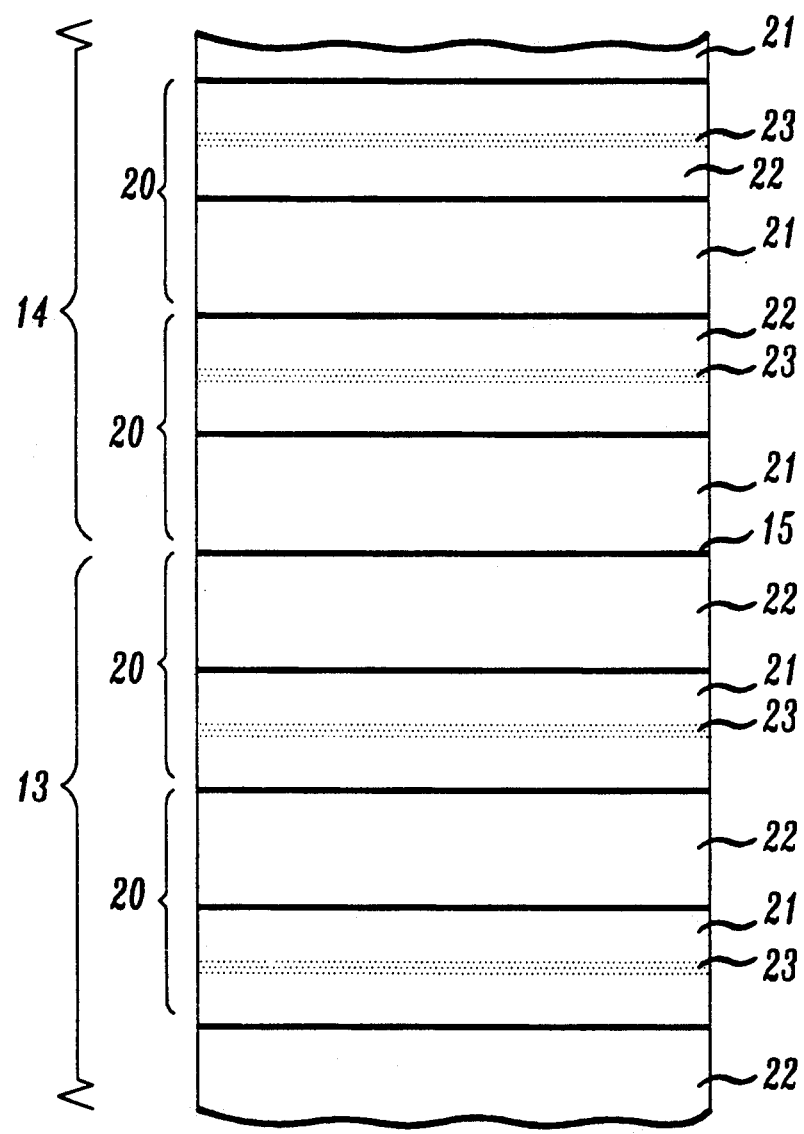
FIG. 2 is a schematic diagram of a portion of the superlattice shown in FIG. 1 including p-n junction and two periods of the superlattice each of different type of conductivity on opposite sides of the p-n junction.

In FIGS. 1 and 2 is shown an exemplary embodiment of Group III-V semiconductor device. For reasons of clarity, the elements of the device are not shown to scale. The device, 10, includes semiconductor structure with a substrate, 11, a buffer layer, 12, a region, 13, having p-type (or n-type) conductivity, a region, 14, having an n-type (or p-type) conductivity, respectively, regions 13 and 14 forming p-n (or n-p) junction 15, a conductive contact layer, 16, and electrical contacts 17 and 18 to the structure. In this device the p-n junction 15 is formed by a superlattice structure, 19, including a plurality of periods, 20, forming a p- (or n-) and n- (or p-, respectively) type conductivity doped regions 13 and 14. Each period 20 consists of a layer, 21, of one binary semiconductor, e.g., InAs (or InP), and a layer, 22, of another binary semiconductor, e.g., GaAs or AlAs or (AlGa)As [or GaP or AlP, or (AlGa)P, respectively]. The layers in each period include a plurality of monolayers, respectively. In each period, a certain number of monolayers of the one semiconductor, e.g., InAs, add up to one layer, e.g., layer 21, and another number of monolayers of the other semiconductor, e.g., GaAs, AlAs or AlGaAs, add up to the second layer, e.g., layer 22. The monolayers in the two layers of each period are present in substantially the same numerical ratio as the cation compositional fraction of each respective binary semiconductor in the lattice-matched ternary or quaternary Group III-V compound semiconductor. Strained layers may also be grown in the same manner.

Carbon (C) has been recognized as an amphoteric dopant material in Group III-V compound semiconductors having small ionization energy, high solid solubility, and an extremely low diffusion in AlAs and GaAs. Carbon diffusivity in III-V compound semiconductors is several orders of magnitude lower than other typical dopants such as Be or Zn. Carbon acts in GaAs or AlAs as a p-type dopant, in InAs as an n-type dopant, and is strongly amphoteric in a $Ga_xIn_{1-x}As$ alloy, wherein $x=0.47\pm0.05$, leading to compensated material. As a result of the amphoteric nature of C, good doping characteristics cannot be achieved with C in this material. However, in accordance with this invention it is possible to use carbon as the sole doping source for either p- or n-type doping of these alloys.

In the specific exemplary embodiment, p-n junctions were grown using $(GaAs)_{3.76}/(InAs)_{4.24}$ superlattice for the p-type region and the n-type region. The device includes n+-InP substrate 11, Si-doped n+-type $Ga_{0.47}In_{0.53}As$ buffer layer 12, C-doped ($2\times10^{16}$ cm$^{-3}$) n-type superlattice region 13, C-doped ($2\times10^{16}$ cm$^{-3}$) p-type superlattice region 14, and p+-type $Ga_{0.47}In_{0.53}As$ contact layer 16. Circular AuBe ($\phi=500$ μm) metallization, annealed at 380° C. for 25 sec., is used as the top ohmic contact 17. Alloyed In metallization 18 to substrate 11 completes the device.

The device was produced by growing superlattice 19 upon an InP substrate by MBE technique. Monolayers were grown by MBE in a preselected sequence, such as to deposit a first plurality of monolayers of one compound, e.g., InAs, followed by a second plurality of monolayers of another compound, e.g., GaAs, the two pluralites of monolayers making up the respective layers 21 and 22, respectively, which, in turn, make up periods 20 of the superlattice. The superlattice includes from 10 to 500 or more, preferably from 100 to 300 periods. Carbon as a dopant is introduced into the center of one layer, e.g. 21, or of another layer, e.g. 22, in each of the periods, depending on the desired conductivity type (p or n) of the superlattice region. Carbon when introduced as a sheet of dopant between the central monolayers of one binary composition shall lead to one type of conductivity, and, when introduced between the central monolayers of another binary composition, shall lead to the opposite type of conductivity. Care should be taken to avoid introduction of carbon into layers of both of the binary compositions, e.g., (InAs and GaAs) of the period, or into monolayers of one binary composition (e.g., InAs or GaAs) adjacent to or interfacing with the carbon-doped monolayers of another binary composition (e.g., GaAs or InAs, respectively). In such instances carbon deposition shall result in compensated regions of ternary composition composed of the adjacent layers of the two binary composition.

Instead of carbon, other amphoteric dopants of Group IV elements, Ge or Si, may be used for obtaining p-type and n-type conductivities. As with carbon, care should be taken to keep the dopant sheets well within the confines of the respective, e.g., GaAs and InAs, layers, so as to avoid diffusion of the dopant into the adjacent, undoped layer. This should assure separate conductivity types and avoid compensation of the compound semiconductor material.

Each period may include from 5 to 15 monolayers of the two compound semiconductors (e.g., GaAs and InAs) forming the ternary or quaternary composition (e.g. $Ga_xIn_{1-x}As$ wherein $x=0.47\pm0.05$). The monolayers in each period are present in a numerical ratio corresponding to the cation compositional ratio in the ternary composition. The monolayers are grown by MBE on substrates kept at a temperature ranging from 410° to 450° C. The temperature is selected to result in smooth, mirror-like surfaces. The cation composition ratio is selected such that the epitaxial layers are lattice matched. Thus, the average composition of the epitaxial layer has such a value that the lattice of the epitaxial layer coincides with the lattice of the substrate on which the superlattice is grown.

For a specific exemplary composition of $Ga_{0.47}In_{0.53}As$, each period 20 consists of 8 monolayers arranged as 3.76 monolayers of GaAs and 4.26 monolayers of InAs, that is in a ratio of 0.47 to 0.53. Introduction of carbon as a carbon-dopant sheet 23 into InAs layers only, and retention of GaAs as an undoped material, results in an n-type conductivity $Ga_{0.47}In_{0.53}As$ region 13 shown in FIGS. 1 and 2. Introduction of carbon as a carbon-dopant sheet 23 into the GaAs layers only, results in a p-type conductivity $Ga_{0.47}In_{0.53}As$ region 14 shown in FIGS. 1 and 2.

The epitaxial layers were grown by MBE on n+-type (S doped) (100)-oriented InP substrates; however, they may be grown on semi-insulating (Fe doped) (100)-oriented InP substrates or p+-type (Zn doped) (100)-oriented substrates, as well. The growth system was an Intevac Gen II system. The growth rate for $Ga_{0.47}In_{0.53}As$ is 1.0 μm/hr and for the two constituents, GaAs and InAs, approximately 0.5 μm/hr each. Growth rate and alloy composition are calibrated using reflection high-energy electron diffraction (RHEED) oscillations. The epitaxial layers discussed here are ordered $(GaAs)_m/(InAs)_n$ superlattices with $m/n=0.47/0.53$ which are lattice-matched to the InP substrate. The period of the superlattice is 8 molecular layers, with the GaAs and InAs layers, 22 and 21, including 3.76 and 4.24 monolayers, respectively. Epitaxial growth at 430° C., near the InAs congruent sublimation temperature (435° C.), resulted in mirror-like epitaxial layer surfaces. At higher growth temperatures, the surface morphology of the superlattices became progressively rougher. The surface roughness was assessed by optical phase-contrast (Nomarski) microscopy. The roughness is most likely related to the strain inherent to the superlattice material system. Although the system is macroscopically lattice matched, the microscopic strain in each of the binary layers favors three-dimensional island growth over layer-by-layer growth. This effect of strain can be reduced by a lower growth temperature.

The epitaxial layers were δ-doped in the center of the InAs and GaAs layers, depending on the desired conductivity type of the superlattice region. The C impurities were evaporated onto the semiconductor surface during growth interruption achieved by closing the Group-III shutter of the respective (In or Ga) effusion cell while the Group V (As) shutter remained open. Therefore, an As-stabilized surface reconstruction was maintained during the δ-doping process. The interruption took place in the center of the respective GaAs and InAs layers. It is the purpose of the δ-function-like doping profiles to keep the C dopants confined to within the InAs or GaAs layers 21 and 22, respectively.

The epitaxial layers were evaluated at room temperature using Hall measurements. The conductivity type, the free carrier concentration, and the Hall mobility were determined using the van der Pauw geometry. Hall measurements on homogeneously doped GaAs layers were used to calibrate the flux of the C effusion cell. Secondary Ionization Mass Spectroscopy (SIMS) was also used to check the concentration in these GaAs layers. The Hall and SIMS results agreed to within 20 percent.

In the preferred exemplary embodiment, the epitaxial layers form $(GaAs)_{3.76}(InAs)_{4.24}$ superlattices with 256 periods and a total layer thickness of $256\times8\times2.94$ Å$=0.6$ μm. In one set of epitaxial layers, e.g., region 13, the InAs layers are δ-doped in the center with C, and the GaAs layers are left undoped as shown in FIG. 2 forming an n-type conductivity region 13. In another set of layers, e.g., region 14, the GaAs layers are δ-doped in the center with C, and the InAs layers are left undoped as shown in FIG. 2 forming a p-type conductivity region 14. The superlattice may be grown in an inverted manner, such that the p-type conductivity region 14 is grown in adjacent substrate 11, and n-type conductivity region 13 is grown subsequently to the p-type conductivity region.

Room-temperature Hall measurements of the epitaxial layers reveal that C doping of the InAs layers and the GaAs layers results in n-type and p-type conductivity, respectively. This demonstrates that only one impurity element can be used in a short-period superlattice to achieve both conductivity types in a semiconductor. The C sheet densities in the thin GaAs and InAs layers were varied between $4 \times 10^9$ cm$^{-2}$ and $1 \times 10^{12}$ cm$^{-2}$, which translates into three-dimensional concentrations of $1.7 \times 10^{16}$ cm$^{-3}$ to $4.2 \times 10^{18}$ cm$^{-3}$, respectively.

Free electron concentrations as high as $2 \times 10^{16}$ cm$^{-3}$ were achieved by C δ-doping of the InAs layers of the superlattice. The Hall electron mobility at this concentration is 2300 cm$^2$/Vs. The electron mobility is somewhat lower than the mobilities in the Si-doped ternary alloy Ga$_{0.47}$In$_{0.53}$As, which possibly indicates additional scattering by either the superlattice structure or by compensating C acceptors. Note that the residual background impurity concentration in Ga$_{0.47}$In$_{0.53}$As is $n \approx 1 \times 10^{15}$ cm$^{-3}$.

The realization of the n-type Ga$_{0.47}$In$_{0.53}$As:C superlattices demonstrates that the C impurities do not redistribute significantly. The InAs layers of the superlattice are approximately 4 monolayers, i.e., 12 Å thick. In order to obtain n-type conductivity, the C impurities must remain within the thin InAs layer. Therefore, it may be concluded that the C impurities do not diffuse or migrate over more than 6 Å during the epitaxial growth process.

Selective δ-doping of the GaAs layers of the superlattice results in p-type conductivity of the Ga$_{0.47}$In$_{0.53}$As superlattice. The hole concentration can be controlled in the $10^{15}-10^{18}$ cm$^{-3}$ range. The highest free hole concentrations achieved by selective C δ-doping of the GaAs layers are $3 \times 10^{18}$ cm$^{-3}$ and a corresponding hole mobility of 40 cm$^2$/Vs. At the lower hole concentration of $1 \times 10^{16}$ cm$^{-3}$, the hole mobility increased to 200 cm$^2$/Vs. This value for the hole mobility is comparable to Be-doped Ga$_{0.47}$In$_{0.53}$As with the same doping concentration. The comparison between Be- and C-doped Ga$_{0.47}$In$_{0.53}$As indicates, that auto-compensation in selectively C doped Ga$_{0.47}$In$_{0.53}$As superlattices is small.

Figure 5:
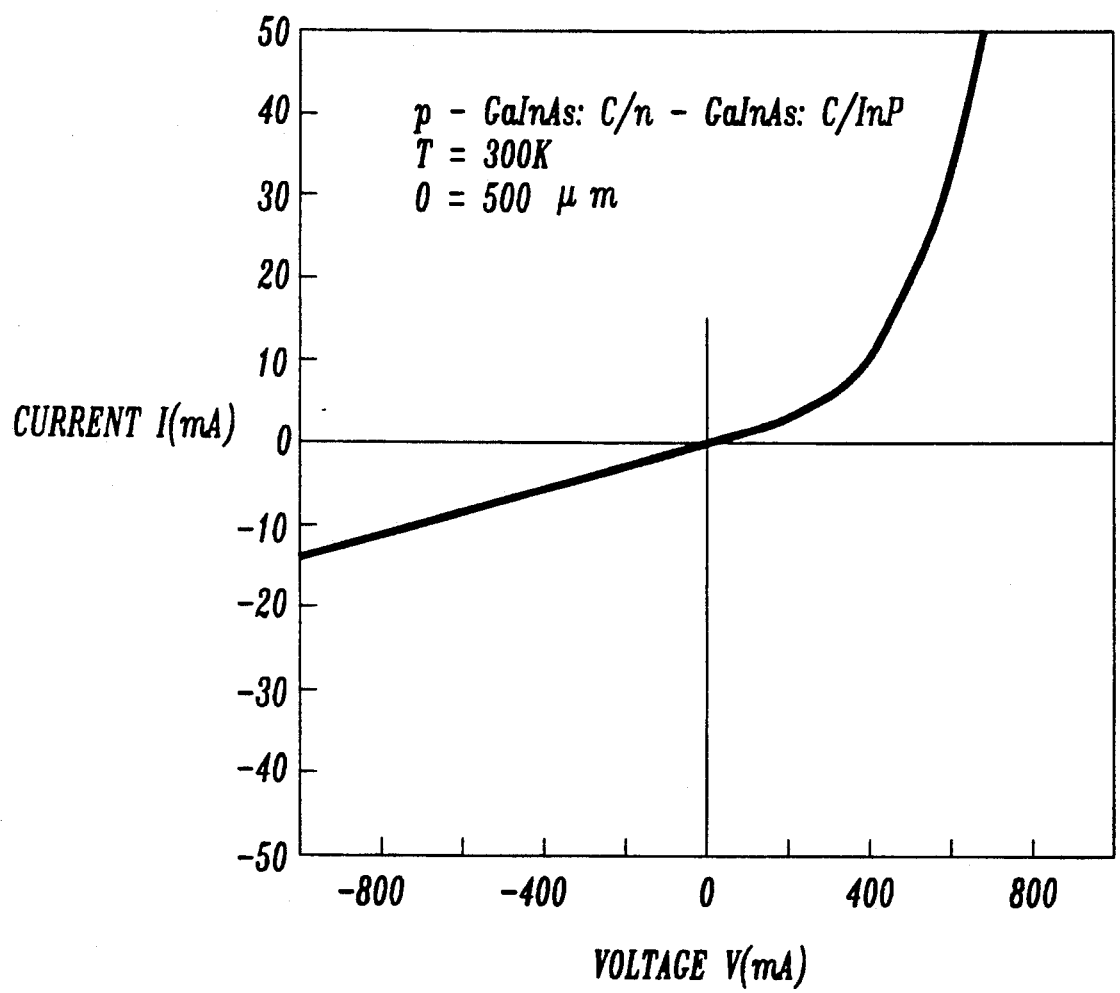
FIG. 5 is a current-voltage characteristic of the GaAs/InAs superlattice p-n junction on an InP substrate.

Current-voltage characteristics of the p-n junctions were evaluated using an Hewlett-Packard 4145B parameter analyzer. For this purpose, the samples were mesa-etched to a depth below the plane of the p-n junction. The current-voltage (IV) characteristic of the 500 μm diameter diodes is shown in FIG. 5. The characteristic is rectifying with a relatively smooth turn-on voltage at 0.4 V. In reverse direction, the current depends linearly on the voltage indicating a resistive leakage which is probably due to point defects in the superlattice or possibly due to surface effects.

Figure 3:
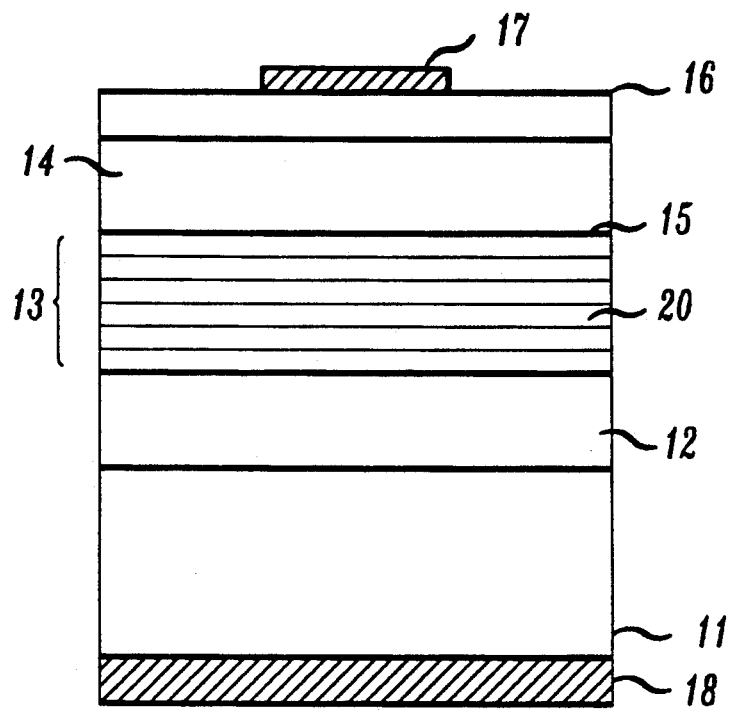
FIGS. 3 and 4 are each a schematic diagram of two versions of a device with a p-n junction in which the superlattice forms a region with one type of conductivity.
Figure 4:
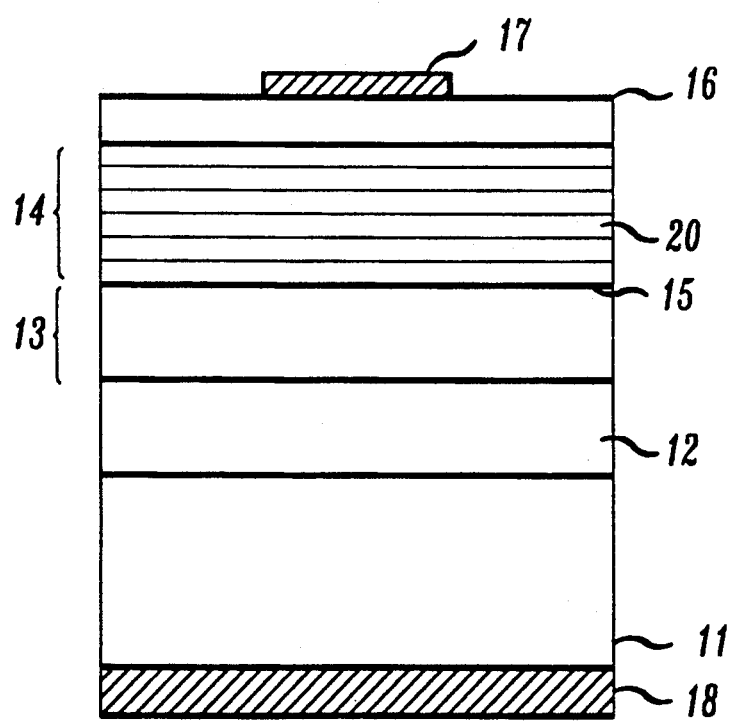

The invention has been described with reference to carbon doped Ga$_{0.47}$In$_{0.53}$As lattice matched to an InP substrate. P-n junctions using a Ga$_{0.515}$In$_{0.485}$P lattice matched to a GaAs substrate may be produced in the same manner. In this case the number of monolayers in GaP and in InP layers 22 and 21, respectively, will be deposited in the ratio of 0.515:0.485. Also, instead of a p-n junction produced by C-doping, GaAs and InAs (or GaP and InP) p-n junctions in which only one of the regions, either p- or n-type conductivity, may be produced with a superlattice in accordance with this invention, e.g., as is shown in FIGS. 3 and 4. The other of the regions, e.g. 14 is FIG. 3 or 13 in FIG. 4, may be produced with conventional dopants. Furthermore, C as the amphoteric dopant may be replaced by Ge or Si. Since these dopants have a higher coefficient of diffusion in III-V semiconductors, care should be taken in placing sheets of these dopants between the monolayers of the respective layers so as to avoid the possibility of Ge or Si acting as the compensating dopant rather than p- or n-type dopant.

Additional advantages and modifications will readily occur to those skilled in the art. Therefore, the invention in its broader aspects is not limited to the specific details, representative devices, and illustrated examples shown and described. Accordingly, various modifications may be made without departing from the spirit or scope of the general inventive concept as defined by the appended claims and their equivalents.

We claim:

1. A p-n junction device which comprises a semiconductor structure including a plurality of layers of Group III-V compound semiconductors and electrodes to the structure, said structure comprising in an ascending order a substrate,
   a buffer layer,
   a superlattice incorporating a p-n junction, and
   a conductive contact layer, wherein
   said superlattice includes a plurality of periods, each period including two layers, one layer of the period having different cation composition than the other layer, said periods being arranged into groups forming two regions, in one of the two regions only said one layer in each period is doped with an impurity which imparts one type of conductivity to said one region and in the other of said two regions only one said other layer in each period is doped with said impurity which imparts an opposite type of conductivity to said other region,
   said dopant is an amphoteric dopant selected from the group consisting of carbon, germanium and silicon, and
   said dopant is introduced by δ-doping selectively into the center of said one layer of each period forming said one region and into the center of said other layer of each period forming said other region.

2. The p-n junction device of claim 1, in which each of the periods includes a plurality of monolayers, ranging in number from 5 to 15 and being present in the two layers of the period in a numerical ratio corresponding to a cation compositional ratio in said compound semiconductor.

3. The p-n junction device of claim 2, in which each period includes 8 monolayers.

4. The p-n junction device of claim 1, in which said dopant comprises carbon.

5. The p-n junction device of claim 1, in which said compound semiconductor is selected from the group consisting of Ga$_x$In$_{1-x}$As, (GaAl)$_x$In$_{1-x}$As, and Al$_x$In$_{1-x}$As, wherein x is $0.47 \pm 0.05$.

6. The p-n junction device of claim 1, in which said substrate comprises InP and said compound semiconductor comprises $Ga_{0.47}In_{0.53}As$.

7. The p-n junction device of claim 6, in which monolayers are of GaAs and of InAs which are present in each period in a ratio of 3.76 to 4.24, respectively.

8. The p-n junction device of claim 6, in which carbon is included in the respective layers in concentrations of from $1 \times 10^{16}$ to $5 \times 10^{18}$ per $cm^3$.

9. The p-n junction device of claim 1 in which said superlattice includes from 10 to 500 of said periods.

10. The p-n junction device of claim 9, in which said superlattice includes from 100 to 300 of said periods.

11. The p-n junction device of claim 1 in which said compound semiconductor is selected from the group consisting of $Ga_yIn_{1-y}P$, $(GaAl)_yIn_{1-y}P$ and $Al_yIn_{1-y}P$ wherein y is $0.515 \pm 0.05$.

12. The p-n junction device of claim 11, in which said substrate comprises GaAs and said compound semiconductor comprises $Ga_{0.515}In_{0.485}P$.

13. The p-n junction device of claim 1, in which said monolayers and the amphoteric dopant are deposited by MBE.

14. The p-n junction device which comprises a semiconductor structure including a plurality of layers of Group III-V compound semiconductors and electrodes to the structure, said structure comprising in an ascending order
a substrate,
a buffer layer,
a region having a first type of conductivity,
a region having a second type of conductivity, and
a conductive contact layer, wherein
one of said regions is a superlattice including a plurality of periods, each of said periods including two layers, one layer of the period having different cation composition than the other layer, in each period said one layer is doped with an impurity which imparts to the region a conductivity type opposite to the conductivity type of the other region, said dopant comprises an amphoteric dopant selected from the group consisting of carbon, germanium and silicon, and said dopant is selectively introduced by δ-doping into the center of said one layer in each period.

15. The p-n junction device of claim 14, in which each of the periods of said one region includes a plurality of monolayers, ranging in number from 5 to 15 and being present in the two layers of the period in a numerical ratio corresponding to a cation compositional ratio in said compound semiconductor.

16. The p-n junction device of claim 15, in which each period includes 8 monolayers.

17. The p-n junction device of claim 14, in which said dopant comprises carbon.

18. The p-n junction device of claim 14, in which said compound semiconductor is selected from the group consisting of $Ga_xIn_{1-x}As$, $(GaAl)_xIn_{1-x}As$, and $Al_xIn_{1-x}As$, wherein $x = 0.47 \pm 0.05$.

19. The p-n junction device of claim 14, in which said substrate comprises InP and said compound semiconductor comprises $Ga_{0.47}In_{0.53}As$.

20. The p-n junction device of claim 19, in which each period comprises monolayers of GaAs and of InAs which are present in a ratio of 3.76 to 4.24, respectively.

21. The p-n junction device of claim 18, in which carbon is included in the respective layers in concentrations of from $1 \times 10^{16}$ to $5 \times 10^{18}$ per $cm^3$.

22. The p-n junction device of claim 14, in which said superlattice includes from 10 to 500 of said periods.

23. The p-n junction device of claim 22, in which said superlattice includes from 100 to 300 of said periods.

24. The p-n junction device of claim 14 in which said compound semiconductor is selected from the group consisting of $Ga_yIn_{1-y}P$, $(GaAl)_yIn_{1-y}P$ and $Al_yIn_{1-y}P$ wherein y is $0.515 \pm 0.05$.

25. The p-n junction device of claim 24, in which said substrate comprises GaAs and said compound semiconductor comprises $Ga_{51.5}In_{48.5}P$.

26. The p-n junction device of claim 14, in which said monolayers and the amphoteric dopant are deposited by MBE.

27. A p-n junction device comprising:
a semiconductor structure including a plurality of layers of Group III-V compound semiconductors and electrodes to the structure, said structure including a superlattice incorporating a p-n junction wherein
said superlattice includes a plurality of periods, each period including two layers, one layer of the period having different cation composition than the other layer, said periods being arranged into groups forming two regions, in one of the two regions only one layer in each period is doped with an impurity which imparts one type of conductivity to said one region and in the other of said two regions only one other layer in each period is doped with said impurity which imparts an opposite type of conductivity to said other region,
said dopant is an amphoteric dopant selected from the group consisting of carbon, germanium and silicon, and
said dopant is introduced by δ-doping selectively into the center of said one layer of each period forming said one region and into the center of said other layer of each period forming said other region.

* * * * *

UNITED STATES PATENT AND TRADEMARK OFFICE
CERTIFICATE OF CORRECTION

PATENT NO.: 5,268,582

DATED : June 24, 1992

INVENTOR(S) : Rose F. Kopf; Erdmann F. Schubert

It is certified that an error appears in the above-identified patent and that said Letters Patent is hereby corrected as shown below:

```
Title page, Item[22] Filed: change "Jun." to   --Aug.--.
```

Signed and Sealed this

Thirtieth Day of December, 1997

*Attest:*

BRUCE LEHMAN

*Attesting Officer*     *Commissioner of Patents and Trademarks*